US006774060B2

(12) United States Patent
Mezey, Sr.

(10) Patent No.: US 6,774,060 B2
(45) Date of Patent: Aug. 10, 2004

(54) METHODS AND APPARATUS FOR THERMALLY PROCESSING WAFERS

(75) Inventor: James J. Mezey, Sr., San Jose, CA (US)

(73) Assignee: Avansys, LLC., Tempe, AZ (US)

( * ) Notice: Subject to any disclaimer, the term of this patent is extended or adjusted under 35 U.S.C. 154(b) by 37 days.

(21) Appl. No.: 09/900,594

(22) Filed: Jul. 7, 2001

(65) Prior Publication Data

US 2001/0046768 A1 Nov. 29, 2001

Related U.S. Application Data

(62) Division of application No. 09/550,888, filed on Apr. 17, 2000.

(51) Int. Cl.[7] .............................................. H01L 21/324
(52) U.S. Cl. ....................................... 438/795; 118/778
(58) Field of Search .................................. 438/778, 795

(56) References Cited

U.S. PATENT DOCUMENTS

| 5,431,958 | A | * | 7/1995 | Desu et al. ............... 427/255.3 |
| 5,440,101 | A | | 8/1995 | Cox et al. .................... 219/388 |
| 685,906 | A | * | 11/1997 | Dietz et al. .................. 117/101 |
| 5,854,468 | A | | 12/1998 | Muka .......................... 219/443 |
| 5,911,896 | A | | 6/1999 | Holden et al. ............... 219/390 |
| 6,111,225 | A | | 8/2000 | Ohkase et al. .............. 219/390 |
| 6,139,641 | A | | 10/2000 | Inokuchi et al. ............ 118/724 |
| 6,214,116 | B1 | | 4/2001 | Shin ............................ 118/640 |

FOREIGN PATENT DOCUMENTS

| EP | 0874387 A1 | 10/1998 |
| JP | 56-32400 | 4/1981 |
| JP | 60-112694 | 6/1985 |
| JP | 10-83966 | 3/1998 |
| JP | 11-312650 | 11/1999 |
| WO | WO 97/31389 | 8/1997 |
| WO | WO 00/12945 | 3/2000 |

OTHER PUBLICATIONS

International Search Report for PCT Application PCT/US01/40511, date of mailing Oct. 2, 2001.
Patent Abstracts of Japan, Publication No. 10083966, Publication Date Mar. 31, 1998, Application Date Jun. 23, 1997, Application No. 09181745, title "Substrate Processing Device," inventor Ikeda.
Patent Abstracts of Japan, Publication No. 11312650, Publication Date Nov. 9, 1999, Application Date Jan. 18, 1999, Application No. 11009728, title "Horizontal Reaction Furnace for Manufacturing Compound Semiconductor," inventor Shin.
Patent Abstracts of Japan, Publication No. 56032400, Publication Date Apr. 1, 1981, Application Date Aug. 16, 1979, Application No. 54103580, title "Vapor Phase Growing Method For Gallium Phosphide Layer," inventor Hisatomi.
Patent Abstracts of Japan, Publication No. 60112694, Publication Date Jun. 19, 1985, Application Date Nov. 21, 1983, Application No. 58218929, title "Gas Phase Growth Method of Compound Semiconductor," inventor Hase.
International Preliminary Examination Report Mailed Jul. 12, 2002.

* cited by examiner

*Primary Examiner*—John F. Niebling
*Assistant Examiner*—Christopher Lattin
(74) *Attorney, Agent, or Firm*—Larry Williams (57) ABSTRACT

The method provides a temperature controlled environment for processing semiconductor wafers at elevated temperatures. A hot wall process chamber is used for the process steps. The process chamber includes three zones with independent temperature control capabilities. The method may include rotating the wafers in addition to providing a gas flow velocity gradient above the wafer for improved temperature and processing uniformity results.

20 Claims, 9 Drawing Sheets

METHODS AND APPARATUS FOR THERMALLY PROCESSING WAFERS

CROSS-REFERENCE TO RELATED APPLICATIONS

The present application is a divisional of U.S. patent application Ser. No. 09/550,888, filed Apr. 17, 2000, now US. Pat. No. 6,331,212. The content of U.S. patent application Ser. No. 09/550,888, filed Apr. 17, 2000 is incorporated herein in its entirety by this reference.

BACKGROUND

This invention relates to improved methods and apparatus for thermally processing workpieces, more particularly, thermally processing semiconductor wafers for electronic device fabrication.

High temperature processing of semiconductor wafers is essential to modern micro electronic device manufacturing. These processes include chemical vapor deposition (CVD), silicon epitaxy, silicon germanium, and rapid thermal processes (RTP) such as implant annealing, oxidation and diffusion drive-in. These are performed at temperatures ranging from about 400 to 1200 degrees Celsius in multi-wafer batch reactors, mini-wafer batch reactors, or in single wafer rapid thermal reactors. Numerous standard textbooks and references exist that described elevated temperature processing of semiconductor wafers. Some example references include Peter Van Zant, "Microchip Fabrication" 3rd edition, McGraw-Hill, New York, 1987; John L. Vossen and Werner Kern, "Thin Film Processes," Academic Press, Orlando, 1978; S. M. Sze, "VLSI Technology," McGraw-Hill, New York, 1988.

As currently practiced, these systems all have serious problems. For example, a typical batch or mini furnace heats about 25 to 200 wafers by radiation from its hot walls. The heating source is usually electrical elements of Ni-Chrome wire arranged into zones for preheat, deposit, and post heat. Each zone is individually profiled and controlled to maintain the desired wafer temperature profile across the length of the zone. However, these furnaces have drawbacks such as the extremely long time at temperature and the long heat up and cool down times associated with loading and unloading the wafers.

An additional problem of furnace systems occurs because the wafer edges are hotter than the wafer center because of the proximity between the wafer edge and the hot wall radiation source. This situation can produce thermal stress in the wafer's crystal lattice and create dislocations that result in slip or other defects. These types of defects are known to cause yield problems in modern devices if the defect occurs in the circuit. Another problem can occur when the wafers become bowed or warped, rendering them unfit for further processing. Typically, the wafers are loaded into quartz or SiC boats with slots for holding the wafers. The areas around the slots cause uniformity problems during processing. Furthermore, the wafers can be pinched and sustain localized stresses which can also cause slip.

Another problem is that the wafers are all exposed to different times at elevated temperature. The front wafer is in the furnace the longest and the rear wafer the least amount of time. CVD processes are highly sensitive to temperature, and time at elevated temperature can cause wafer-to-wafer uniformity problems.

Today's devices require line widths of less than one micron, and junction depths as small as 25 angstroms. In addition, 300 mm wafers have a reduced thermal budget cycle, thus the temperature processing time must be reduced to limit lateral and downward dopant diffusion to meet the required thermal budget cycle.

To meet these requirements, the industry has developed different approaches. One is a reduced batch size furnace with increased spacing between the wafers, thus allowing faster load/unload times with better process uniformities on the wafers.

Another technique is the use of RTP systems which process one wafer at a time and typically uses high intensity quartz halogen lamps as a heat source. They can rapidly heat the wafer at up to 150° C./sec to temperature ranges from about 400° C. to 1200° C. RTP cuts the cycle time by an order of magnitude or more, reduces the time at temperature, and eliminates dopant diffusion problems. With the improvement in process uniformities the RTP systems produce, RTP effectively competes with the furnaces.

In a typical RTP system, the lamps are positioned in optical reflectors at a distance outside of a process chamber that is made of clear fused quartz. The clear fused quartz allows most of the lamp energy to pass through the process chamber to heat the wafer and wafer holder. However, the quartz chamber absorbs some of the energy from the lamps as well as radiation from the wafer and holder. The process chamber must be kept cool to prevent unwanted deposits from coating the process chamber walls. A coating on the processing wall interferes with the radiant energy transfer to the wafer; also, the coating can produce unwanted particles that can get onto the wafer. The wafer edges are close to the cooled wall and this can cause slip and process problems. Due to the cold wall requirement, growth rates using silicon gases are limited so as to minimize the deposits on the process chamber walls. For applications using silane, the growth rate is limited to only about 0.2 microns/minute.

Another problem with using lamps is that only a small portion (approximately 30%) of the lamp energy is directed to the region of the wafer location. The portion of the lamp energy is so small because the lamps are positioned at a distance from the wafer. Specifically, the lamps are outside of the chamber and zoned to deliver energy to one area of the wafer. Consequently, temperature uniformity improvements are difficult to achieve. The heating characteristics of the wafer can change drastically for changes as simple as adjusting the lamp power to achieve a desired temperature. Although the lamps are housed in sophisticated reflectors in an attempt to control the radiated energy, these reflectors and the lamp filaments degrade with time and use, causing unwanted temperature changes across the wafer. Furthermore, a radiant heating system requires many lamps (up to 300) to heat a single wafer, and a great deal of power (up to 300 KW). Lamp heated reactors require sophisticated heating and temperature control systems that are problematic.

Wafer temperature measurement and temperature control are critical to process results for thermal processes. Temperature measurement for lamp-heated systems is also very difficult since the temperature sensor may be affected by the incidental radiation from the lamps and the variations from the wafer surface, which change with temperature and if the wafer is patterned. Typically, the temperature is measured only in a few locations and temperature gradients generally are not measured or controlled during processing.

The use of multipoint thermocouple wafers is commonly used to help profile the lamp power output. However, this exposes the reactor to metallic contamination, and since the wafer cannot be rotated using this technique, temperature gradients due to gas flow etc, are not accounted for.

The wafers are typically loaded onto a susceptor that has a pin lift mechanism to raise/lower the wafers. These pins can scratch the backs of the wafers, create particles, and cause local temperature variations at the pin area. This can cause defects in the crystal structure of the silicon wafer and deposition uniformity problems. The particles on the backside of the wafers can contaminate other wafers during the loading/unloading in the wafer handler. In general, 300 mm wafers are relatively thinner than the 200 mm wafers and require many more pin support points, yet the 300 mm backside surface specification calls for a reduction in backside marks.

Standard systems also have problems related to controlling the temperature of the process gases. When gases are introduced into the system the wafer is cooled at the leading edge. This may cause slip and degrade film quality. The industry recognizes this problem. In response, the industry has attempted to reduce the problem by preheating the gases and using slip rings at the outer areas of the wafer. However, the changes that have been made are still unsatisfactory and failed to fully address the problems of thermally processing wafers, particularly large diameter wafers.

Clearly, there are numerous applications requiring reliable and efficient methods and apparatus for thermally processing workpieces such as semiconductor wafers. Unfortunately, typical methods and apparatus for old-style thermal processing have characteristics that are inadequate for some current applications and future applications. There is still a need for semiconductor wafer thermal processing systems to provide improved temperature control for the wafer and the process gases. There is a need for systems that are simple to operate and simple to maintain. There is a need for systems that provide improved particle performance, improved process results, and higher throughput.

SUMMARY

This invention seeks to provide methods and apparatus that can overcome deficiencies in known methods and apparatus for thermally processing workpieces such as semiconductor wafers. One aspect of the present invention includes methods and apparatus for thermally processing semiconductor wafers using a hot wall process chamber having an isothermal zone for performing the elevated temperature processing step. The process chamber is contained in a housing for easier gas handling. Heaters for the process chamber are located between the housing and the process chamber. The heaters are configured to produce a highly stable and highly uniform temperature for the isothermal zone. Gas flow over the wafer is controlled to achieve uniform processing results. A further aspect of the invention includes having zones in the process chamber for which the temperature can be independently controlled for each zone so that the temperature of the process gas can be controlled before the gas has reached the wafer and after the gas has passed the wafer.

Another aspect of the invention includes an apparatus having improved components for lifting and rotating the wafer so as to reduce particle generation, simplify wafer loading, and improve wafer processing uniformity.

A still further aspect of the invention includes an apparatus having components that provide energy efficiency during elevated temperature wafer processing. The apparatus also includes components for efficient use of process gas.

It is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

The above and still further features and advantages of the present invention will become apparent upon consideration of the following detailed descriptions of specific embodiments thereof, especially when taken in conjunction with the accompanying drawings.

DESCRIPTION

The operation of embodiments of the present invention will be discussed below in the context of the deposition of an epitaxial layer on a wafer. It is to be understood, however, that embodiments in accordance with the present invention may be used to perform essentially any semiconductor wafer-processing step that requires elevated temperatures, particularly those steps requiring temperature uniformity across the wafer. Reviews of semiconductor wafer processing steps that require elevated temperatures are readily available in both the patent literature and the standard scientific literature.

Figure 1:
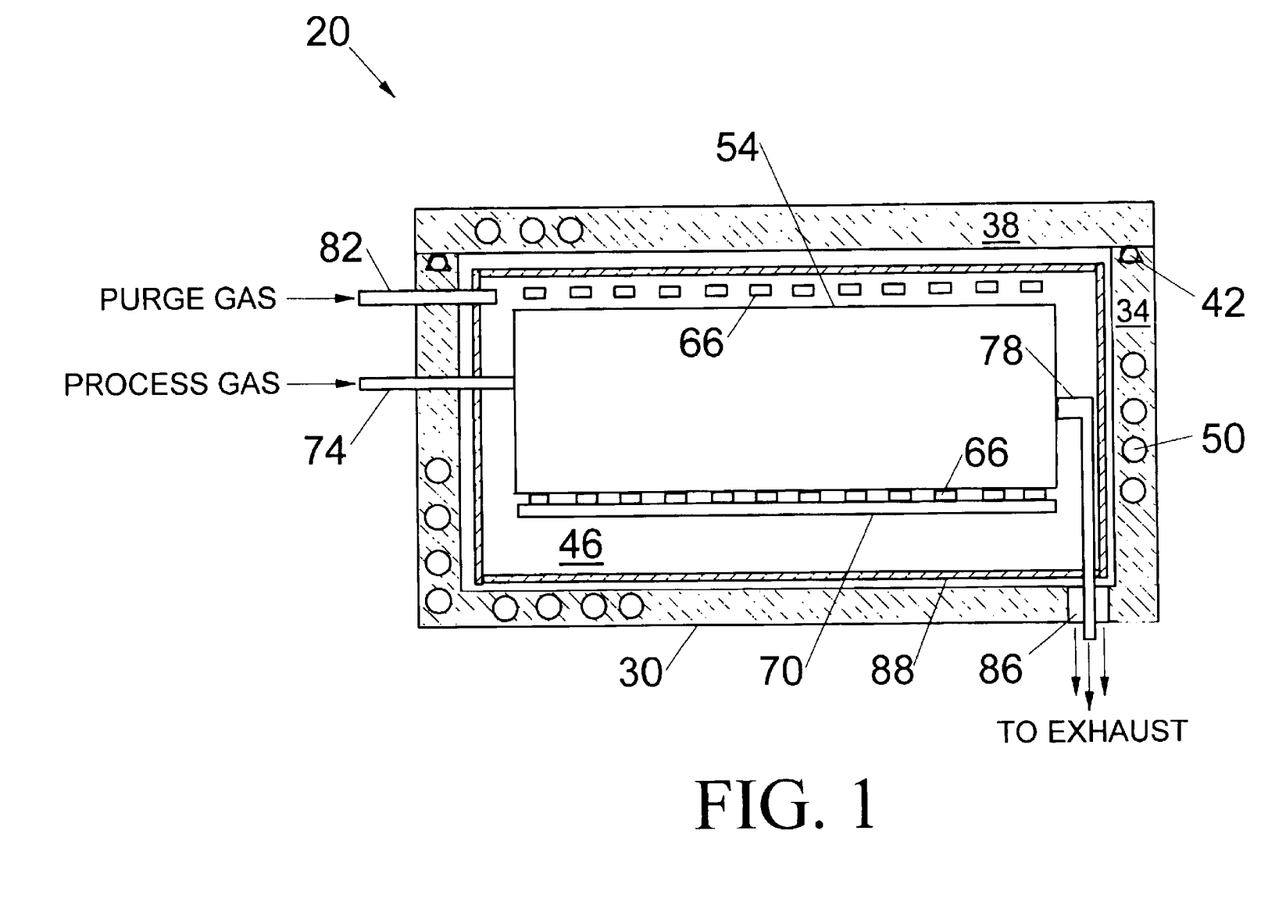
FIG. 1 is a cross-sectional view of an embodiment of the present invention.

Reference is now made to FIG. 1 wherein there is shown an apparatus 20 for thermally processing workpieces such as semiconductor wafers. The apparatus includes a housing 30. In a preferred embodiment, housing 30 includes a main body 34 and at least one detachable component such as a lid 38. Main body 34 and lid 38 are configured so as to form a substantially gas tight contact. The gas tight contact can be any type of standard removable seal 42 such as, for examples, seals that use O-rings and seals that use gaskets. Housing 30 encloses volume 46. In some embodiments, housing 30 includes construction materials such as ceramics, quartz, aluminum alloys, and iron alloys such as stainless steel. In a preferred embodiment, housing 30 is configured for active cooling. In one embodiment, housing 30 has walls forming coolant conduits 50 for carrying coolant. In an alternative embodiment, housing 30 includes cooling coils (not shown). The cooling coils contact the surface of housing 30 so as to be capable of removing heat when there is a coolant flow through the coils.

A process chamber 54 is mounted in housing 30. Preferably, process chamber 54 is constructed of a thermally refractory material. Examples of suitable materials include silicon carbide, silicon carbide coated graphite, graphite, quartz, silicon, ceramic, aluminum nitride, aluminum oxide, silicon nitride, magnesium oxide, zirconium oxide, and ceramics.

Process chamber 54 includes a process zone (not shown in FIG. 1). In preferred embodiments, the process zone is maintained at a substantially isothermal processing temperature during the primary process step. A wafer support (not shown in FIG. 1) supports the wafer in the process zone so that the wafer experiences the substantially isothermal processing temperature during the primary process step. Embodiments of the present invention may include different configurations for the wafer support. For example, in one embodiment the wafer support includes a bottom inside surface of the process zone. In embodiment, the wafer support includes a plate (not shown) located in the process zone.

A preferred embodiment includes a plurality of electric powered heating elements 66 disposed between housing 30 and process chamber 54 for heating process chamber 54. FIG. 1 shows a cross-section of heating elements 66 arranged along the top surfaces and bottom surfaces of process chamber 54. Heating elements 66 may also be arranged along the side surfaces of process chamber 54; for the sake of clarity, heating elements 66 are not shown along the side surfaces in FIG. 1.

Variations in the distance between heating elements 66 and process chamber 54 provide alternative embodiments of the invention. For a particular embodiment, the distance will be determined by the type of heating elements 66 and a selected mode of operation for heating process chamber 54. Examples of the types of heating elements that are suitable for heating elements 66 include electrical resistance strip heaters, IR lamps, RF power induction heaters, and arc lamps.

In a preferred embodiment, the electrical resistance strip heaters are silicon carbide coated graphite strip heaters. The strip heaters are commercially available and are used in a variety of high temperature applications.

Examples of embodiments of the present invention that use strip heaters include one embodiment in which the strip heaters have direct physical contact with process chamber 54. In an alternative embodiment, the strip heaters are arranged to substantially avoid direct physical contact with process chamber 54. In yet another alternative embodiment, the strip heaters and process chamber 54 sandwich a third body (not shown in FIG. 1) therebetween.

A temperature control system (not shown in FIG. 1) controls power delivered to heating elements 66. At least one temperature sensor (not shown in FIG. 1) derives temperature information for at least one of:

a) heating elements 66, b) process chamber 54, and c) the wafer (not shown in FIG. 1).

A preferred embodiment includes a plurality of temperature sensors arranged so as to derive temperature information for the temperature control system. Preferred locations for measuring temperatures for the control system include process chamber 54, heating elements 66, and the wafer (not shown in FIG. 1). The temperature control system is configured to be responsive to temperature information from the at least one temperature sensor; more preferably, the temperature control system is configured to be responsive to temperature information from the plurality of temperature sensors. Standard temperature sensors that can be used in semiconductor processing are usable for embodiments of the present invention. Some examples of temperature sensors that can be used include thermocouples, pyrometers, and thermometers.

At least one heat shield 70 is shown disposed between heating elements 66 and housing 30. In alternative embodiments, substantially all heating elements 66 may be associated with a heat shield. For the sake of clarity, FIG. 1 only shows heat shield 70 along the bottom of process chamber 54. Heat shield 70 performs at least one function of:

a) obstructing heat transfer between process chamber 54 and housing 30 so as to reduce energy requirements for heating process chamber 54, b) providing a support for heating elements 66, and c) providing a support for process chamber 54.

In a preferred embodiment, heat shield 70 is made of a thermally refractory material. Examples of materials that can be used for heat shield 70 are quartz, silicon carbide, silicon carbide coated graphite, and ceramics. In one embodiment, heat shield 70 is connected with housing 30 and heat shield 70 is arranged so that heat shield 70 supports process chamber 54. As a further embodiment, a support arm (not shown in FIG. 1) connects heat shield 70 to housing 30 so as to support heat shield 70 in housing 30. Preferably, the support arm is made of a thermally refractory material; examples of suitable materials are quartz and ceramics. In other embodiments, multiple heat shields may be disposed between heating elements 66 and housing 30.

In another embodiment, a support arm (not shown in FIG. 1) connects process chamber 54 with housing 30 so as to support process chamber 54 in housing 30. Preferably, the support arm is made of a thermally refractory material; examples of suitable materials are quartz and ceramics.

A gas inject conduit 74 is connected with process chamber 54 for carrying process gases to process chamber 54. A gas exhaust conduit 78 is connected with process chamber 54 for removing exhaust gases from process chamber 54. Preferably, inject conduit 74 and exhaust conduit 78 are made of thermally refractory materials such as quartz, silicon carbide, and ceramics.

Housing 30 is connected with an input purge gas conduit 82 for providing purge gas to volume 46 of housing 30. Housing 30 has a port 86 for removing purge gas from volume 46 of housing 30. In another embodiment, exhaust conduit 78 is configured to pass through housing 30 via port 86.

Housing 30 is arranged to provide electrical connections to heating elements 66. Standard electrical feed-throughs (not shown in FIG. 1) are commercially available for this task. In addition, housing 30 is arranged to accommodate the temperature sensors. For example, if the temperature sensors include thermocouples, then housing 30 has feed-throughs for thermocouples. Similarly, if the temperature sensors include pyrometers, then housing 30 has holes or other types of feed-throughs to accommodate the pyrometers or optical fibers used in conjunction with the pyrometers.

As an alternative embodiment of the present invention, a liner 88 is positioned adjacent to the interior surfaces of housing 30. Liner 88 is arranged to protect areas of the interior surfaces of housing 30. For example, in applications involving deposition processes, liner 88 is arranged so as to substantially prevent deposition onto the interior surfaces of housing 30. Consequently, process gases that may leak from process chamber 54 have a lower probability of depositing material onto housing 30.

Preferably, liner 88 includes materials that are stable so that liner 88 can be subjected to cleaning processes such as liquid cleaning processes, gas cleaning processes, and physical Is cleaning processes to remove deposits on surfaces of liner 88. Examples of materials that are suitable for liner 88 include quartz and ceramics. In preferred embodiments, liner 88 is removable so that liner 88 can be removed, cleaned, and reinstalled in housing 30.

In a preferred embodiment for some deposition applications, liner 88 is arranged so that housing 30 contacts liner 88 such that liner 88 maintains an operating temperature that is substantially higher than the temperature of housing 30. An advantage of this arrangement is that the higher temperature of liner 88 helps to reduce deposition on liner 88 from process gas that may escape from process chamber 54. Such an arrangement can be achieved through design of the contacts that allow conductive heat transfer between liner 88 and housing 30. In one embodiment, the contacts allowing conductive heat transfer are held at the minimum required for stable support of liner 88 in housing 30.

Figure 1A:
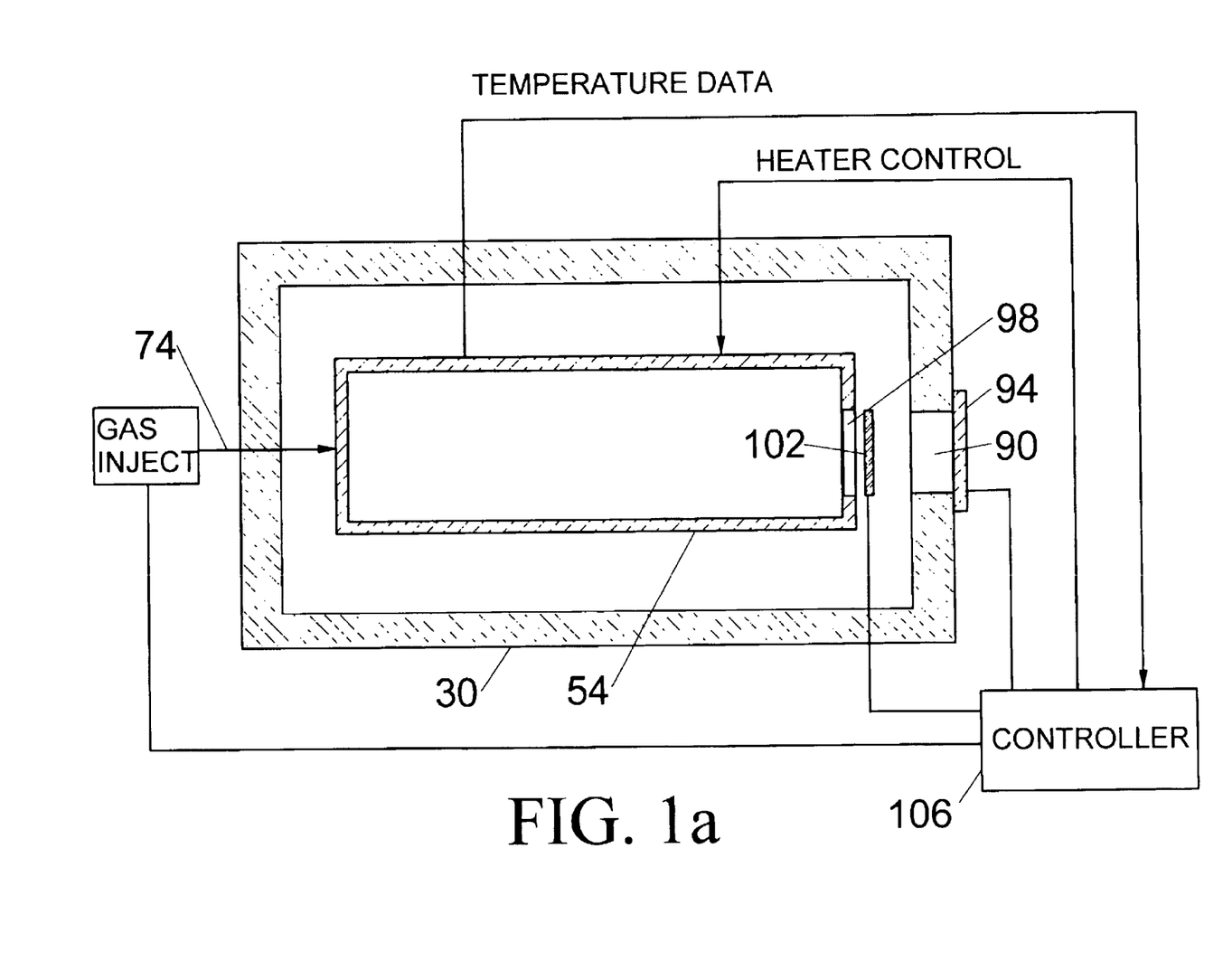
FIG. 1a is another view of the apparatus shown in FIG. 1.

Referring now to FIG. 1a wherein there is shown another view of an embodiment of the present invention. Housing 30 is shown having a port 90 for loading and unloading the wafer to and from housing 30. In a preferred embodiment, a housing access plate 94 is disposed adjacent to port 90 and is movably connected with housing 30 so as to provide access to the interior of housing 30 during wafer loading and unloading and so as to isolate the interior of housing 30 during wafer processing. Housing access plate 94 is movable to a first position for wafer loading and unloading; housing access plate 94 is movable to a second position for isolating housing 30 during wafer processing.

Process chamber 54 is shown having a port 98 for loading and unloading the wafer to and from process chamber 54. Port 90 and port 98 are arranged so that they can be aligned for moving the wafer into and out of process chamber 54. Chamber access plate 102 is disposed proximate to port 98. Chamber access plate 102 is movably connected with process chamber 54, housing 30, heat shield 70 (not shown in FIG. 1a), or combinations thereof. Access plate 102 is movable between a first position and a second position so that the first position allows access to port 98 in process chamber 54 so that the wafer can be loaded and unloaded. When access plate 102 is in the second position, access plate 102 obstructs access to port 98 in process chamber 54 so as to reduce radiant heat loss from the interior of the process chamber during wafer processing. In another embodiment, access plate 102 has heating elements 66 for heating access plate 102.

In one embodiment, the second position for access plate 102 maintains a space between access plate 102 and process chamber 54 so that there is substantially no contact between access plate 102 and process chamber 54 in the regions surrounding access port 90. The space maintained between process chamber 54 and access plate 102 serves to reduce the possibility of generating particles from physical contact between access plate 102 and process chamber 54.

Controller 106 is connected with access plate 102 and housing access plate 94 to control the movement of access plate 102 and access plate 94 to allow loading and unloading the wafer. In an alternative embodiment, controller 106 also includes the temperature control system. In further embodiments, controller 106 is configured to control process gas flow to process chamber 54.

Figure 2:
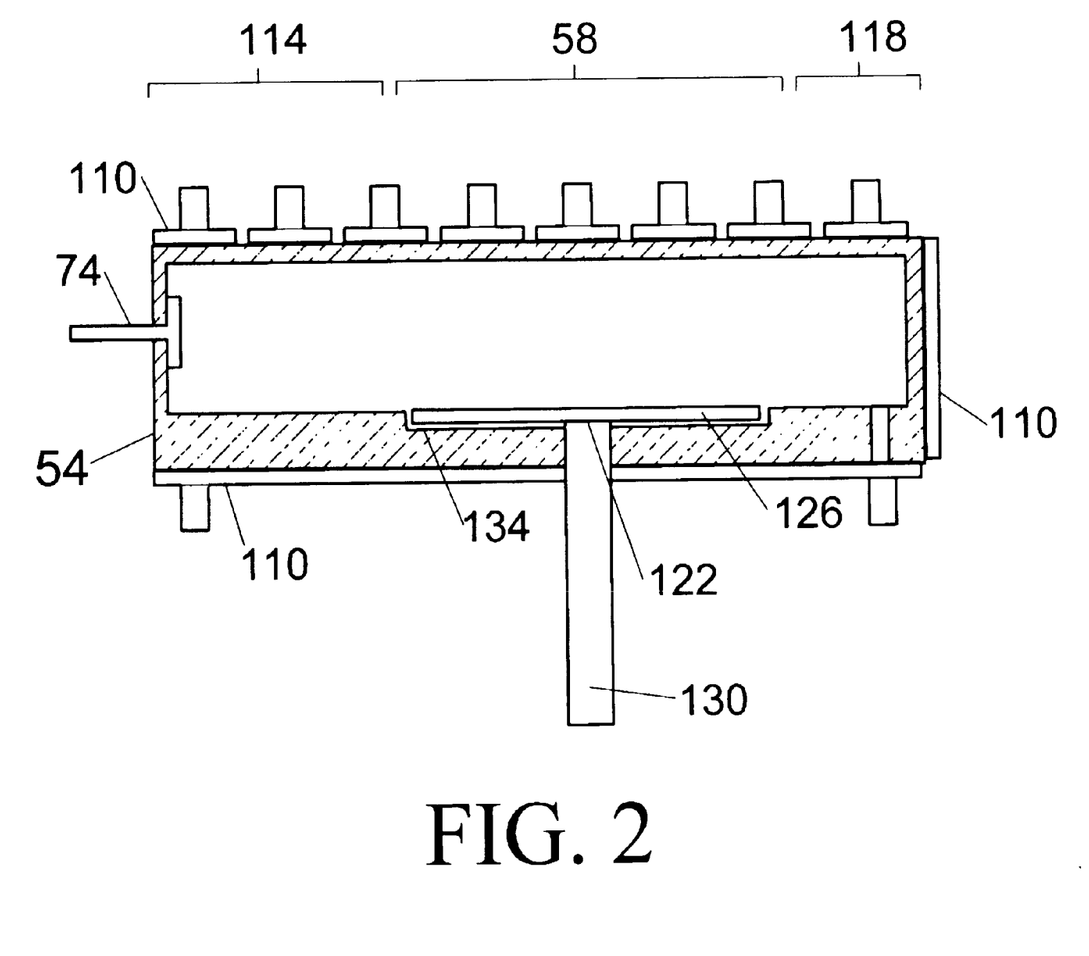
FIG. 2 is a cross-sectional view of an embodiment of the process chamber shown in FIG. 1.

Reference is now made to FIG. 2 wherein there is shown a cross-sectional view of an embodiment of process chamber 54. Process chamber 54 includes three zones: a process zone 58, a preprocess zone 114, and a postprocess zone 118. Process zone 58 separates preprocess zone 114 and postprocess zone 118.

A wafer support 122 is arranged so as to be capable of supporting the wafer in process zone 58. Wafer support 122 is connected with process chamber 54 so as to allow rotation of wafer support 122 and to allow rotation of the wafer when supported on wafer support 122. Wafer support 122 includes a disk 126 having a substantially planar area for contacting the backside of the wafer. Preferably, the area of wafer support 122 contacting the wafer, i.e. disk 126, is smaller than the area of the wafer so as to facilitate loading and unloading the wafer. Wafer support 122 further includes a wafer holder stem 130 connected substantially at the center of disk 126, at about a 90-degree angle. In one embodiment, process chamber 54 has a hole in the bottom surface and stem 130 extends from disk 126 through the hole in the bottom of process chamber 54. Stem 130 is rotatably coupled to a motor (not shown in FIG. 2) to allow rotation of wafer support 122 about the axis of stem 130.

The embodiment presented in FIG. 2 further shows that process zone 58 has a recessed area 134. The dimensions of recessed area 134 are selected to allow disk 126 to hold the wafer so that the front surface of the wafer is substantially planar with the surrounding bottom surface of process zone 58 so as to shield the backside of the wafer from backside deposits when used in deposition related processes.

In operation, the wafer is loaded onto disk 126. Disk 126 is maintained at substantially the same temperature as process zone 58. In preferred embodiments, the wafer is supported by disk 126 so that pin lifts are unnecessary. Thus, the wafer is not subjected to backside scratches from the pin lifts; fewer particles are generated; and less crystal stress is generated in the wafer.

Preprocess zone 114 is connected with process gas inject conduit 74 so that process gases can enter process chamber 54 through preprocess zone 114. Postprocess zone 118 is connected with exhaust gas conduit 78 (not shown in FIG. 2) so that process gases can exit process chamber 54 through postprocess zone 118.

Consequently, process gas enters preprocess zone 114; flows through process zone 58 in a direction substantially parallel to the surface of disk 126; and flows out of process chamber 54 through postprocess zone 118.

A plurality of electrical resistance strip heaters 110 are disposed about the exterior of process chamber 54. For the embodiment shown in FIG. 2, strip heaters 110 are in contact with process chamber 54. It is to be understood that the embodiment shown in FIG. 2 is but one of a variety of possible arrangements of strip heaters 110 with respect to process chamber 54. For the embodiment shown in FIG. 2, strip heaters 110 are arranged along the top surface of process chamber 54; strip heaters 110 are arranged along the bottom surface of process chamber 54; and, strip heaters 110 are arranged along the side surfaces of process chamber 54.

Strip heaters 110 are connected with the temperature control system (not shown in FIG. 2) so that preprocess zone 114, process zone 58, and postprocess zone 118 can each be controlled at an independent temperature or, in an alternative embodiment, they can all be controlled to the same temperature. Specifically, preprocess zone 114 can be controlled at a preprocess temperature, process zone 58 can be maintained at a process temperature, and postprocess zone 118 can be maintained at a postprocess temperature. The ability to control the temperatures of the three zones independently is an advantage of some embodiments of the present invention. This advantage is realized because of the capability of measuring temperatures at multiple locations and the ability to independently control the power delivery to individual members of strip heaters 110.

For example, one or more temperature sensors can be arranged to measure the temperature of a particular strip heater and the temperature of the strip heater can be controlled in response to the temperature measurements. Alternatively, one or more temperature sensors can be arranged to measure the temperature of a particular location on the process chamber and the temperature of that area of the process chamber can be controlled.

An advantage of having independent temperature control is that process gas entering preprocess zone 114 can be preheated before the process gas enters process zone 58 containing the wafer. Preheating the process gas allows greater control of the wafer temperature during processing. In other words, preheating the process gas helps to reduce cooling of the wafer by the process gas. In applications such as epitaxial film growth, maintaining the wafer at a uniform temperature helps to prevent the formation of defects in the epitaxial film. For applications involving chemical vapor deposition, the uniform wafer temperature reduces non-uniformities in film thickness and film properties that can be caused by wafer temperature non-uniformities. Furthermore, advantages from having uniform wafer temperatures can be realized for other integrated circuit fabrication processes that involve elevated temperature wafer processing.

Another advantage of having independent temperature control for the three zones is that postprocess zone 118 can be used to maintain the exhaust gas at the postprocess temperature until the exhaust gas is out of process chamber 54 and displaced away from process zone 58. In applications involving deposition, controlling the exhaust gas temperature allows for control of the properties of material deposited in postprocess zone 118. For example, by maintaining postprocess zone 118 at a preselected temperature, exhaust gases exposed to postprocess zone 118 deposit material at a preselected temperature. Preferably, the preselected temperature is selected to be a temperature at which films of good quality are deposited in the postprocess zone rather than films that are of poor quality. Films of poor quality include films that have properties such as poor adhesion to process chamber 54. Non-adherent wall deposit is well known as a source of particulate contaminants for semiconductor wafer processing. Another example of a poor quality film includes films having etching characteristics that are inconsistent or incompatible with the etch characteristics of film deposited in process zone 58. The inconsistent or incompatible etch characteristics make it more difficult to clean process chamber 54; this can be a particularly serious problem for in situ clean processes.

A further advantage of independent temperature control of the process zones is the ability to maintain exhaust zone 118 at a temperature lower than the temperature of process zone 58. The lower temperature of exhaust zone 118 allows the exhaust gas to slowly cool down prior to entering cooled sections of the exhaust conduit. In some applications, failure to properly cool the exhaust gas can induce a thermal shock for the exhaust gas; the thermal shock can cause heavy deposits to form in the exhaust conduit. Deposits in the exhaust line are potentially dangerous; the deposits can produce volatile species and may be pyrophoric when exposed to air for system cleaning.

Still another advantage of having independent temperature control for the three zones is that process zone 58 can be maintained at the process temperature during the wafer processing step. Preferably, process zone 58 is maintained at substantially isothermal conditions during the wafer processing step. Isothermal conditions for process zone 58 are more easily achieved for embodiments of the present invention in which the temperature control system includes multiple temperature sensors and independent control of power delivery to individual strip heaters. Similar benefits are obtainable for other types of heating elements such as infrared lamps, arc lamps, and RF induction heaters.

Figure 3:
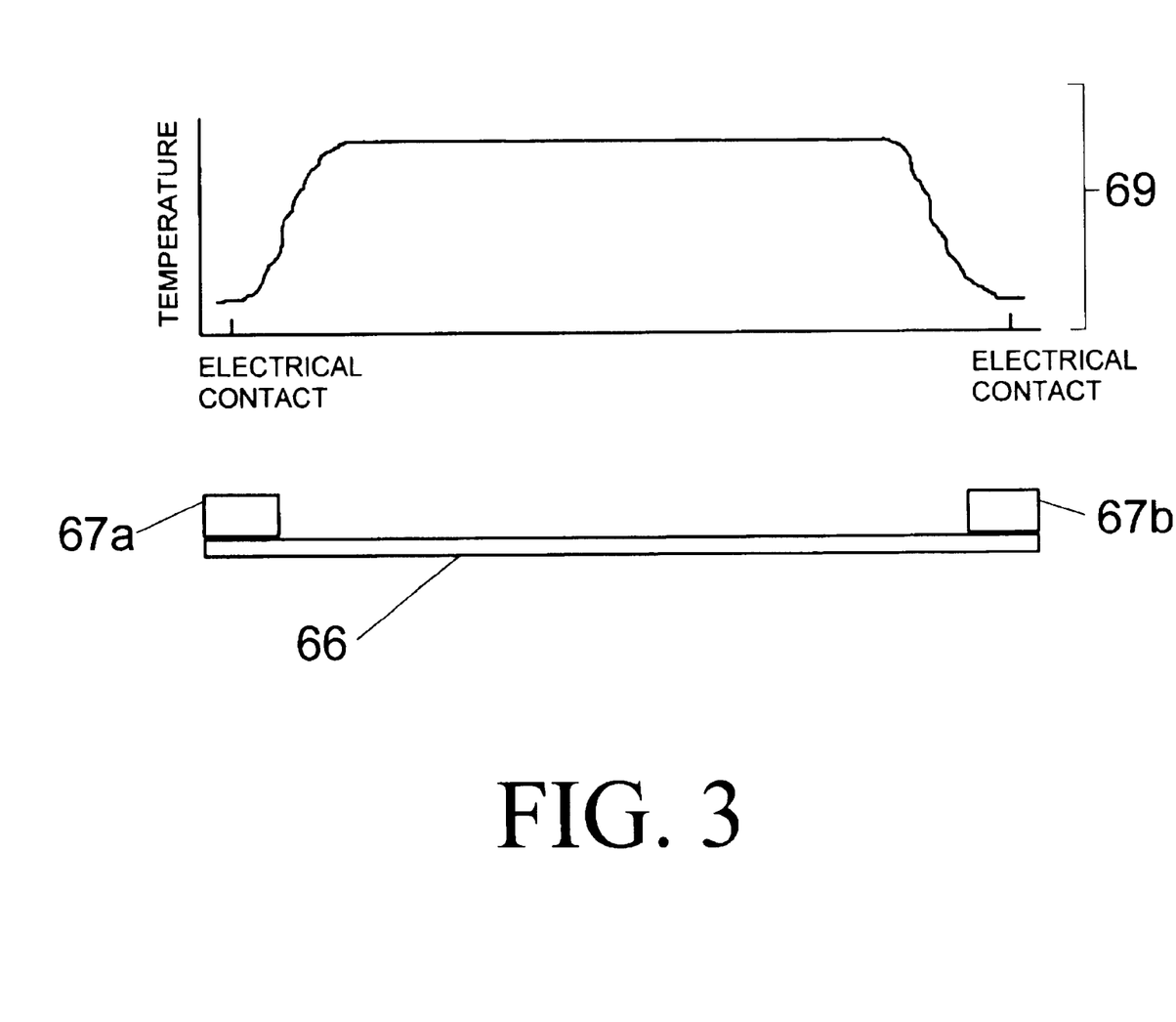
FIG. 3 is a hypothetical representative temperature profile for an electric powered heating element.

Referring now to FIG. 3 wherein there is shown heating element 66. Electrical connector 67a and electrical connector 67b form electrical contacts to heating element 66 so as to allow an electric current to pass between electrical connector 67a and electrical connector 67b through heating element 66. Plot 69 shows a hypothetical example of a temperature profile for heating element 66 in operation. Temperatures of heating element 66 near electrical connector 67a and electrical connector 67b, typically, are substantially lower than the temperatures for other current carrying regions of heating element 66. Typically, the lower temperatures near the electrical contacts are required so as to accommodate standard electrical wiring materials like copper. In order to achieve suitable temperatures at the electrical contacts, heating elements such as strip heaters are designed so that the strip heaters have a lower resistance in the region of the electrical contact. The lower resistance causes less heating of the strip heater at the electrical contact locations. However, regions of heating element 66 having positions away from the electrical contacts are able to maintain substantially isothermal temperatures. Specifically, electrical resistance strip heaters are designed to have a higher electrical resistance for the substantially isothermal sections and a lower electrical resistance for the electrical contact regions.

Figure 3A:
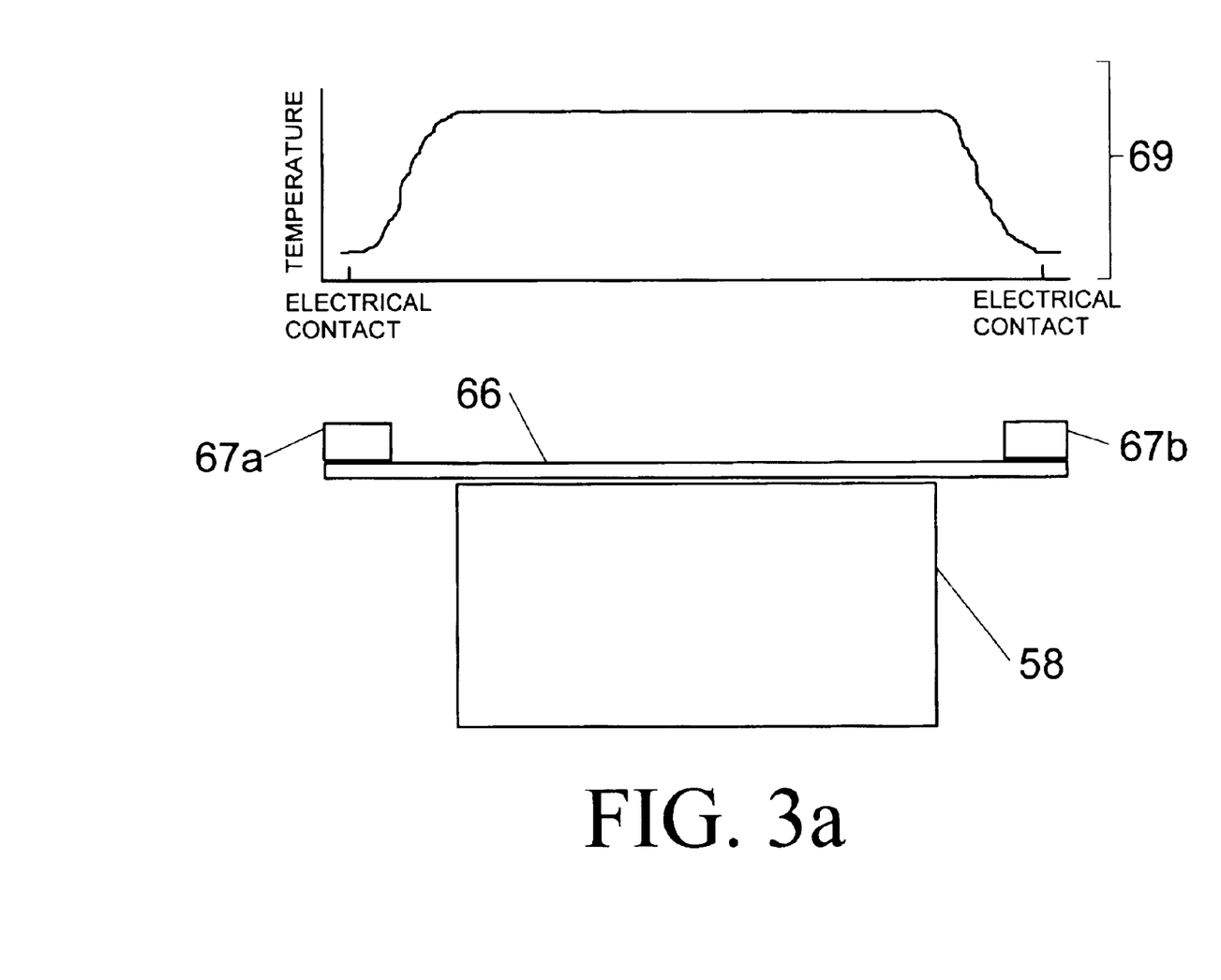
FIG. 3a is an example configuration for using an electric powered heating element.

In one embodiment of the present invention, only the substantially isothermal sections of heating element 66 are used to achieve substantially isothermal conditions for process zone 58. For example, the non-isothermal sections of heating element 66 are spaced away from process zone 58 so that temperature control of process zone 58 is not substantially affected by the non-isothermal sections of heating element 66. This can be achieved by arranging the substantially isothermal sections of heating element 66 in positions that are closer to process zone 58 while arranging the non-isothermal sections to be further away from process zone 58. As an example configuration, heating element 66 can be sized to be larger than process zone 58 so that the non-isothermal sections of heating element 66 extend beyond the boundaries of process zone 58 as is shown in FIG. 3a. In other words, the electrical contacts are positioned away from process zone 58.

Another configuration includes orienting, such as by bending or shaping, the non-isothermal sections of heating element 66 away from process zone 58 so that the heat applied to process zone 58 substantially all comes from isothermal sections of heating element 66. Additional configurations will be apparent to those of ordinary skill in the art.

In other embodiments, preprocess zone 114 and postprocess zone 118 can be maintained isothermally using the configurations just described for process zone 58. However, for many applications only the process zone needs to be isothermal.

Figure 4:
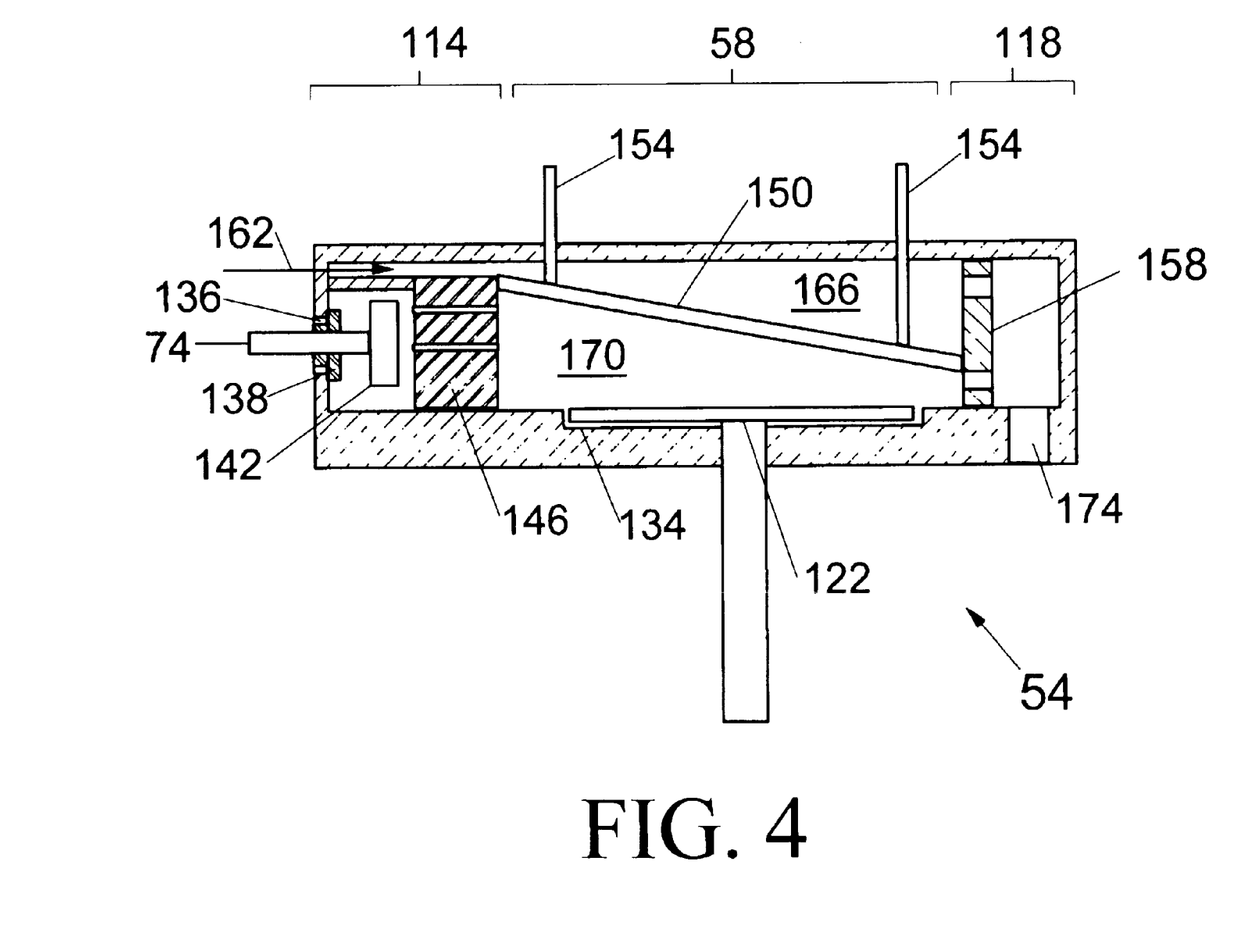
FIG. 4 is a cross-sectional view of another embodiment for the process chamber.

Referring now to FIG. 4 wherein there is shown a cross-sectional view of another embodiment of process chamber 54. Process chamber 54 includes preprocess zone 114, process zone 58, and postprocess zone 118. Gas inject conduit 74 is connected with preprocess zone 114 so as to provide process gas to process chamber 54. In one embodiment, process chamber 54 has a hole 136 through which gas inject conduit 74 passes into process chamber 54. A seal bushing 138 forms a seal around gas inject conduit 74 so as to restrict process gas loss from process chamber 54. In one embodiment, sealed bushing 138 does not form a gas tight seal so that seal bushing 138 can allow gas leakage between process chamber 54 and housing 30.

In one embodiment, gas inject conduit 74 includes a gas dispersion head 142 having holes for dispersing process gas in preprocess zone 114 of process chamber 54.

A process gas preheater 146 is located between gas dispersion head 142 and process zone 58 so that process gases entering preprocess zone 114 pass through gas preheater 146 before entering process zone 58. Gas preheater 146 facilitates heating the process gas to the preprocess temperature. Gas preheater 146 includes a body of a thermally refractory material such as silicon carbide, silicon carbide coated graphite, quartz, and ceramics. Gas preheater 146 has a plurality of holes for allowing the process gas to pass therethrough. In a preferred embodiment, the holes in gas preheater 146 are arranged to distribute the process gas so that the process gas is urged to maintain laminar flow upon exit from gas preheater 146.

Process zone 58 has recessed area 134 in the bottom surface of process chamber 54. Wafer support 122 is positioned in process zone 58. Wafer support 122 has disk 126 for contacting the wafer. In a preferred embodiment, disk 126 is arranged to fit into recessed area 134 so that the top surface of the wafer can be held substantially planar with respect to the areas of the bottom surface of process zone 58 that surround recessed area 134. Wafer support 122 is arranged so as to allow rotation of the wafer during processing. Specifically, wafer support 122 is coupled with process chamber 54 so as to allow rotation of the wafer support. A motor (not shown in FIG. 4) is rotatably coupled to wafer support 122 so as to cause rotation of wafer support 122.

A velocity gradient plate 150 is connected with process chamber 54. Preferably, velocity gradient plate 150 is substantially rigid and is substantially inert to the process gas. Velocity gradient plate 150 is arranged adjacent to the wafer support so as to define one side of a channel for process gas flow over the wafer holding surface of wafer support 122, such that the cross-sectional area for the channel decreases in the direction of the process gas flow in response to perpendicular distance variations between velocity gradient plate 150 and the wafer holding surface of wafer support 122. Preferably, velocity gradient plate 150 includes a refractory material. Examples of materials that can be used in velocity gradient plate 150 include materials such as quartz, silicon carbide, silicon carbide coated graphite, and ceramics.

In another embodiment, velocity gradient plate 150 is movably connected with process chamber 54 so that the distance between velocity gradient plate 150 and wafer support 122 can be adjusted as another process parameter. Preferably, the distance between velocity gradient plate 150 and wafer support 122 can be adjusted and the angle between velocity gradient plate 150 and wafer support 122 can be adjusted. As an example, velocity gradient plate connector 154 suspends velocity gradient plate 150 from the top of process chamber 54. The length of connector 154 can be varied so as to change the position of velocity gradient plate 150 with respect to wafer support 122.

Velocity gradient plate 150 causes the process gas to have improved mass transfer characteristics as the process gas flows over the wafer. For applications involving processes such as deposition, epitaxial growth, and other applications requiring reactants in the process gas, the improved mass transfer characteristics help to compensate for depletion of reactants in the process gas. The reduction of depletion affects improves uniformity of deposited layer properties such as thickness uniformity, composition, optical properties, and electrical properties.

Velocity gradient plate 150 is positioned adjacent to gas preheater 146 so that process gas exiting gas preheater 146 is influenced by velocity gradient plate 150 as the gas passes through process zone 58.

For embodiments of the present invention having pyrometers for measuring wafer temperature, velocity gradient plate 150 may include holes (not shown in FIG. 4) to allow viewing the wafer using optical fibers without obstructions caused by velocity gradient plate 150. Preferably, the holes are sized so as to leave the process gas flow through process zone 58 substantially unaffected.

In an alternative embodiment, velocity gradient plate 150 has an inverted "U" shape for improved confinement of process gas flow above the wafer. For this embodiment, opposite edges of velocity gradient plate 150 are directed downward so that velocity gradient plate 150 defines at least part of the sidewalls of the channel for gas flow above the wafer. An exhaust baffle plate 158 separates process zone 58 from postprocess zone 118. Baffle plate 158 has at least one hole to allow gas flow from process zone 58 into postprocess zone 118. One function of baffle plate 158 is to help to reduce back circulation of gases from postprocess zone 118 back into process zone 58.

In another embodiment, preprocess zone 114 includes a process chamber purge gas injector 162 for providing a purge gas such as hydrogen or an inert gas to process chamber 54. In a preferred embodiment, purge gas injector 162 is configured to flow purge gas from preprocess zone 114 through volume 166 of process zone 58. Volume 166 substantially excludes volume 170, located between velocity gradient plate 150 and wafer support 122. One function of the purge flow is to help confine the process gas flow to volume 170 so as to maximize the process gas exposure to the wafer. The process chamber purge gas flow is particularly important for embodiments in which velocity gradient plate 150 has holes for temperature measurement. The purge gas flow exits process chamber 54 via postprocess zone 118. Exhaust baffle plate 158 has at least one hole for conveying the purge gas from process zone 58 to postprocess zone 118. Postprocess zone 118 has a hole 174 for exhaust gas and purge gas to exit process chamber 54.

Figure 5:
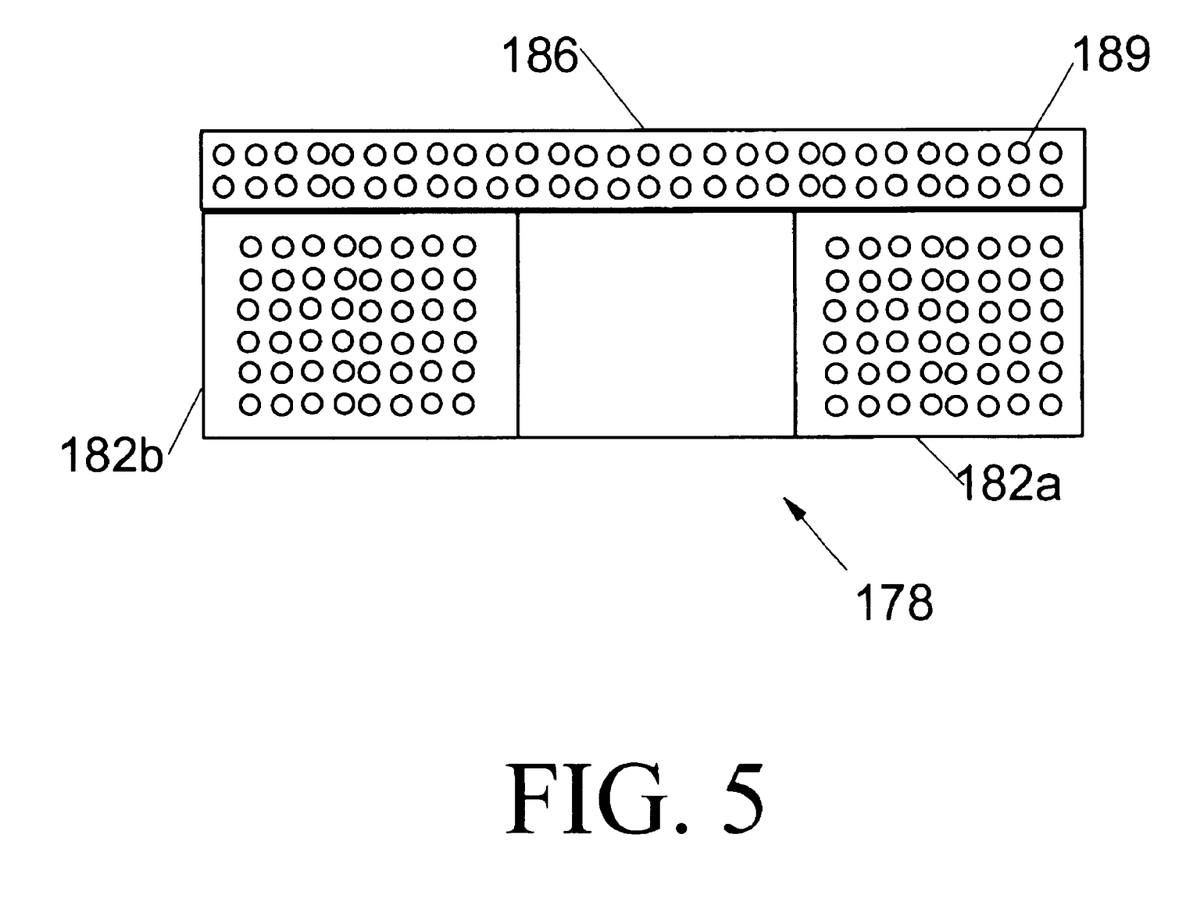
FIG. 5 shows an example of gas injectors for the process chamber.

Referring now to FIG. 5 wherein there is shown a view of an example of a gas injector 178 for process gas and purge gas flows to process chamber 54. Gas injector 178 includes three sections: process gas sections 182a and 182b for carrying process gas and a purge gas section 186 for carrying purge gas. Each section has a plurality of holes 189. In a preferred embodiment, the holes are substantially parallel within a section. The holes distribute the process gas so that the direction of the gas flow is substantially parallel to the plane of the wafer holder. In other words, a showerhead type of gas flow is directed approximately parallel to the wafer surface. As a further embodiment, gas injector 178 is arranged so that the gases can be selectively distributed across the wafer independently or together so as to obtain improved process uniformity control. Improved uniformity is obtainable by selectively distributing the gas across the wafer to compensate for variations in reaction rate caused by thermal gradients and gas flow.

Figure 6:
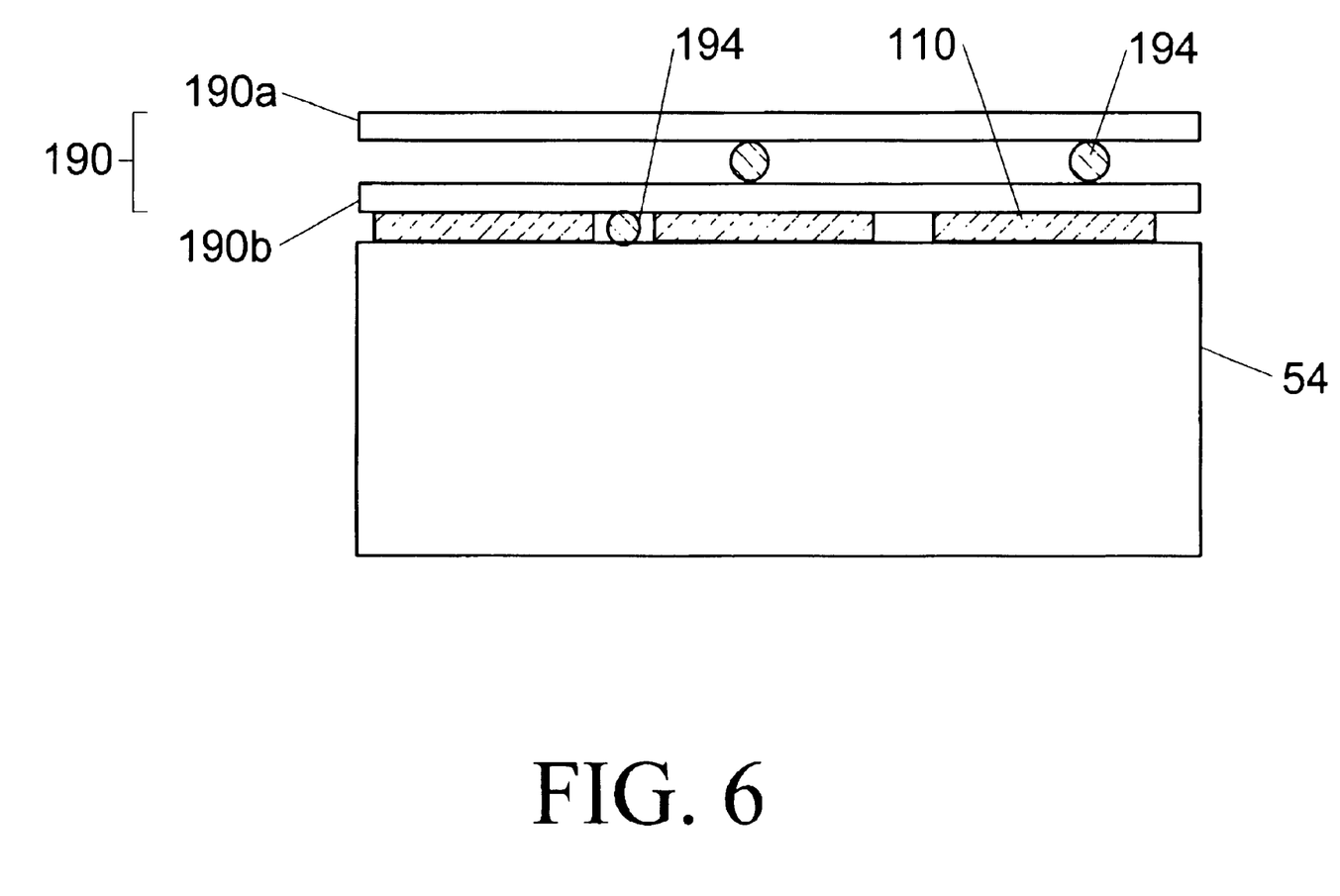
FIG. 6 shows an alternative embodiment for heat shields.

In addition, the vertical showerhead configuration enables high growth rates, typical of showerheads, while avoiding problems with particulates that are common for some of the conventional showerheads. For example, the vertical showerhead is less likely to have particles fall from the showerhead onto the wafer surface. Embodiments of the present invention, for deposition applications, include showerhead materials having good adhesion properties for the material being deposited. Referring now to FIG. 6 wherein there is shown an example configuration for heat shields 190. Heat shields 190 include a first heat shield 190*a* and a second heat shield 190*b*. Heat shield 190*a* and heat shield 190*b* are positioned to provide heat shielding for the same areas of process chamber 54. In order to reduce conductive heat transfer between heat shield 190*a* and heat shield 190*b*, a space is maintained between the heat shields. Preferably, physical contact between the heat shields is held at a minimum. In one embodiment, the space between the heat shields is maintained by placing one or more spacers 194 between the heat shields. Suitable materials for spacers 194 include thermally refractory materials such as quartz, polysilicon, silicon carbide, silicon carbide coated graphite, and ceramics. In a preferred embodiment, spacers 194 are shaped like balls having diameters about equal to the desired spacing to be maintained between the heat shields. Spacers 194 can also be used to maintain desired spaces between other components of the apparatus such as heating elements 66, strip heaters 110, and process chamber 54. As shown in FIG. 6, spacer 194 is used to maintain a space between heat shield 190*b* and an outer surface of process chamber 54. The strip heater 110 is shown sandwiched between heat shield 190*b* and process chamber 54.

In an alternative embodiment, the heat shields have surface structures that produce substantially the same result achieved using the spacers just described. For example, the heat shields can have protrusions from the surface of the heat shield so that the protrusions substantially maintain the desired spacing between adjacent heat shields or other adjacent surfaces.

For various embodiments of the present invention, a single heat shield may be used or multiple heat shields may be used for heat shielding the same area.

Figure 7:
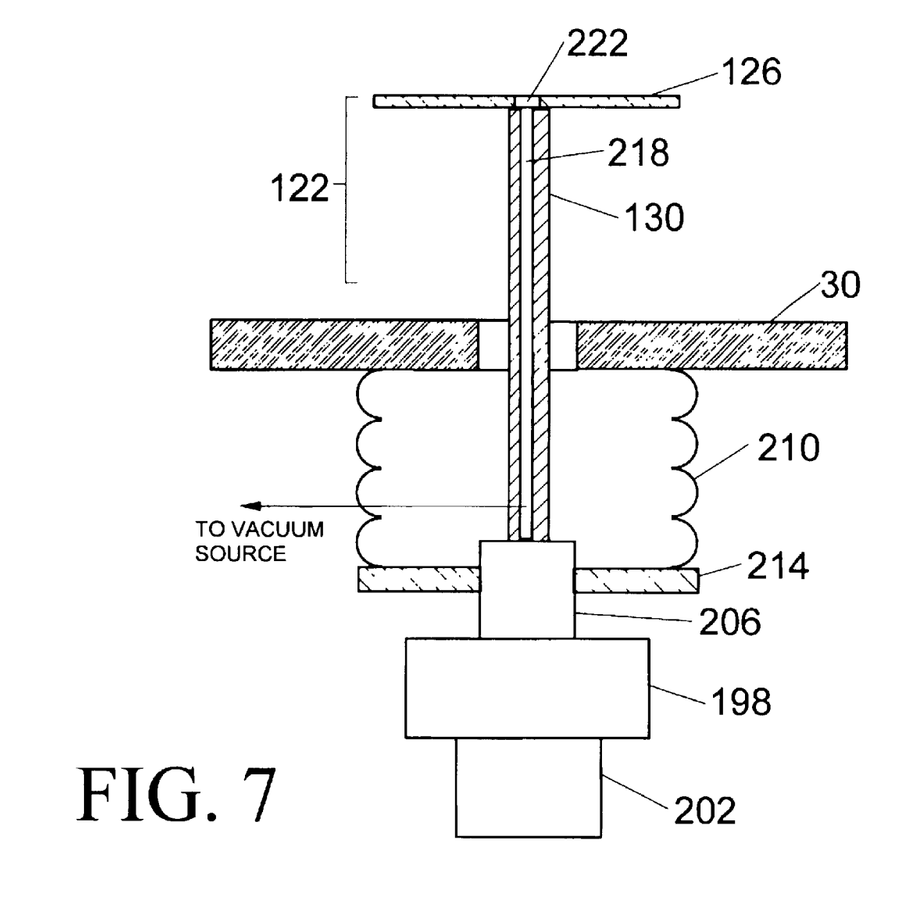
FIG. 7 shows a diagram of a rotation and lift system.

Referring now to FIG. 7 wherein there is shown wafer support 122 including disk 126 and wafer holder stem 130. Wafer holder stem 130 is attached substantially at the center of disk 126 so that wafer support 122 can rotate about the axis of wafer holder stem 130 to rotate the wafer. Wafer holder stem 130 extends through process chamber 54 (not shown in FIG. 7); wafer support 122 is connected with process chamber 54 to allow rotation of wafer support 122. Wafer holder stem 130 extends through the bottom surface of housing 30; wafer holder stem 130 is connected with the bottom of housing 30 to allow rotation of wafer support 122.

Wafer holder stem 130 is rotatably coupled to a motor 198 for rotating wafer support 122. A linear actuator 202 is connected with motor 198; linear actuator 202 is capable of lifting and lowering motor 198. Motor 198 is coupled to wafer holder stem 130 so that lifting and lowering of motor 198 by linear actuator 202 causes wafer holder 122 to be lifted and lowered. Lifting and lowering wafer support 122 can be used to facilitate loading and unloading wafers to and from wafer support 122.

In one embodiment, a rotary feedthrough 206 such as a standard commercially available rotary feed through is connected between motor 198 and wafer holder stem 130 so as to transfer rotary motion and up-and-down motion. A bellows 210 is connected to the bottom of housing 30 at one end of bellows 210. Bellows 210 surrounds wafer holder stem 130. A mounting plate 214 is attached to the other end of bellows 210. Preferably, the attachments to bellows 210 are substantially gas tight. Rotary feed through 206 is attached to mounting plate 214 so as to enable rotation of wafer support 122 by motor 198. Bellows 210 is configured so as to allow up and down motion of motor 198 for lifting and lowering wafer support 122.

In another embodiment, wafer holder stem 130 has a bore such as axial bore 218. Disk 126 has a hole 222 corresponding to axial bore 218. Wafer holder stem 130 is configured to have a vacuum source apply a vacuum to axial bore 218 so that a low pressure is generated at hole 222. Preferably, the low-pressure generated at hole 222 is sufficient to enable disk 126 to function as a vacuum chuck for holding the wafer on wafer support 122.

An advantage of embodiments of the present invention, due to the process chamber materials and hot wall operation, is the removal of the conventional growth rate restrictions for applications such as silicon epitaxy. Embodiments of the present invention can allow epitaxial silicon growth with high intrinsic resistivity values at substantially higher growth rates and higher temperatures without wall deposit problems. Furthermore, the advantages of no pattern shift, no distortion, and no washout with patterned wafers are maintained using a non-chlorinated silicon source.

Clearly, embodiments of the present invention can be used or a wide variety of elevated temperature processes for semiconductor device fabrication. Changes in the selected process gases allow embodiments of the present invention to be suitable for semiconductor wafer processing steps such as annealing, activating dopant, depositing by chemical vapor deposition, depositing by epitaxial deposition, doping, forming a silicide, nitriding, oxidizing, reflowing a deposit, and recrystallizing.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. A method for thermally processing a semiconductor wafer, the method comprising the steps of:

a. providing a process chamber;

b. generating a substantially isothermal hot wall process zone in the process chamber using substantially isothermal sections of electrical resistance strip heaters;

c. loading the wafer in the process zone;

d. rotating the wafer;

e. flowing a preheated gas over the wafer in a direction substantially parallel to the wafer surface;

f. inducing a velocity gradient in the preheated gas so that the velocity of the gas increases in the direction of the gas flow; and g. maintaining the gas in zones held at preselected temperatures until the gas exits the process chamber.

2. The method of claim 1 further comprising the step of restricting heat loss from the heaters and process chamber.

3. The method of claim 1 further comprising the step of capturing substantially all process gas leakage from the process chamber.

4. The method of claim 1 wherein step b comprises measuring temperatures at multiple locations.

5. The method of claim 1 further comprising, after step d, the step of measuring the temperature at multiple locations on the wafer while the wafer is rotating.

6. The method of claim 1 wherein the gas recited in step e is selected so as to cause a semiconductor wafer processing step selected from the group consisting of annealing, activating dopant, depositing by chemical vapor deposition, depositing by epitaxial deposition, doping, forming a silicide, nitriding, oxidizing, reflowing a deposit, and recrystallizing.

7. The method of claim 6 further comprising the step of enclosing the process chamber in a housing.

8. A method for thermally processing a semiconductor wafer, the method comprising the steps of:
   a) providing a process chamber;
   b) enclosing the process chamber in a substantially cold-wall housing;
   c) generating a substantially isothermal hot wall process zone in the process chamber using substantially isothermal sections of electrical resistance strip heaters and measuring temperatures at multiple locations on at least one of heaters and wall of the process chamber to control the temperature of the process zone;
   d) restricting heat loss from the heaters and process chamber;
   e) loading the wafer into the process zone;
   f) rotating the wafer;
   g) monitoring the temperature of the wafer by measuring the temperature at multiple locations on the wafer while the wafer is rotating;
   h) flowing a preheated gas over the wafer in a direction substantially parallel to the wafer surface;
   i) inducing a velocity gradient in the preheated gas so that the velocity of the gas increases in the direction of the gas flow;
   j) capturing substantially all process gas leakage from the process chamber; and
   k) maintaining the gas in zones held at preselected temperatures until the gas exits the process chamber.

9. In combination, the steps of:
   a) containing a wafer in a substantially isothermal process zone;
   b) rotating the wafer within the process zone;
   c) monitoring the temperature of the wafer while the wafer is rotating;
   d) flowing a preheated gas over the wafer in the process zone in a direction substantially parallel to the wafer surface;
   e) inducing a velocity gradient in the preheated gas so that the velocity of the gas increases in the direction of the gas flow as the gas passes over the wafer.

10. The combination of claim 9 wherein the isothermal process zone is heated using substantially isothermal sections of electrical resistance strip heaters.

11. The combination of claim 10 wherein monitoring the temperature of the wafer comprises measuring the temperature of the wafer at multiple locations on the wafer.

12. The combination of claim 11 wherein the gas comprises a silicon containing compound.

13. The combination of claim 10 wherein the rotation rate and the velocity gradient produce improved uniformity of heat and mass transfer to the top surface of the wafer.

14. The combination of claim 12 further comprising the step of pre-heating the gas in a pre-heat zone so as to reduce the amount of cooling of the wafer by the gas.

15. The combination of claim 14 further comprising the step of maintaining the temperature of the gas high enough so as to substantially prevent deposition of non-adherent wall deposit proximate to the process zone.

16. The combination of claim 15 further comprising the step of providing a postprocess zone for controlled cooling of the gas after the gas leaves the process zone so as to substantially prevent thermal shock induced deposition.

17. The combination of claim 14 further comprising the step of cooling the gas leaving the process zone slowly enough so as to substantially prevent thermal shock induced deposition.

18. The combination of claim 9 further comprising the step of distributing the preheated gas flow over the surface of the wafer.

19. The combination claim 9 further comprising the step of inducing substantially laminar flow of the preheated gas before the gas reaches the edge of the wafer.

20. A method for thermally processing a wafer, the method comprising:
   a) step for maintaining the wafer at a substantially isothermal temperature;
   b) step for rotating the wafer for improved heat and mass transfer uniformity;
   c) step for inducing a gas flow having a velocity gradient above the surface of the wafer for improved heat and mass transfer uniformity for the surface of the wafer;
   d) step for controlling the temperature of the gas so as to reduce the amount of cooling of the wafer by the gas;
   e) step for controlling the temperature of the gas so as to substantially prevent deposition of non-adherent layers that cause particle contamination of the wafer.

* * * * *